June 5, 1956 D. A. KELLY 2,749,441

PHASE SHIFT OSCILLATOR

Filed Aug. 28, 1952

INVENTOR.
DUNFORD A. KELLY
BY Forrest J. Lilly
Attorney 2,749,441
Patented June 5, 1956

2,749,441

PHASE SHIFT OSCILLATOR

Dunford A. Kelly, Los Angeles, Calif.

Application August 28, 1952, Serial No. 306,914
16 Claims. (Cl. 250—36)

Figure 1:
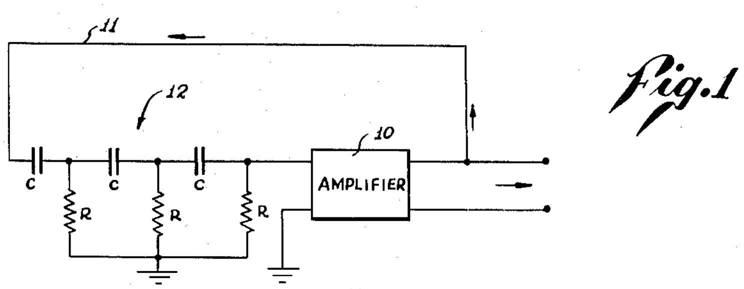

This invention relates to electric oscillators and more particularly to oscillators utilizing resistance-reactance tuning in which distortion is reduced to an unprecedented degree.

Heretofore, oscillators used in laboratory testing have been capable of producing sine waves with as low as 1/10 of 1% distortion over a reasonably broad range of frequencies. While these oscillators are useful for most testing purposes requiring substantially pure sine waves, accurate distortion measurements on electronic equipment having the same order of magnitude of distortion necessitate a signal generator producing a sine wave whose distortion is negligible by comparison. Otherwise, the distortion introduced by the signal generating oscillator itself will mask the distortion to be measured in the equipment. The provision of an extremely pure signal is also desirable for other types of measurements previously considered impractical, such as the determination of non-linearity in resistors and capacitors.

It is a primary object of the present invention, therefore, to provide an oscillator in which distortion is reduced to a far lower level than has been achieved in the past.

More particularly, it is an object of the invention to provide an oscillator having a distortion level less than 1/1000 of 1% over a wide range of frequencies.

A further object is to provide such an oscillator in which the output signal voltage is substantially independent of any connected load.

Two well known resistance-reactance type oscillators have been developed. One form may be termed a bridge oscillator, in which oscillations occur at the frequency where the transmission of the bridge is a minimum. A bridge, band elimination filter, or other null network may be employed.

The other form is the phase shift oscillator. This type usually comprises a signal inverting amplifier having as few stages as possible and a single positive feedback loop including a ladder network of resistances and reactances, usually capacitors. The ladder network is of such proportions as to shift the phase of the output signal fed back to the amplifier input by about 180 degrees. This amount of phase shift added to the phase inversion in the amplifier, produces positive feedback, resulting in sustained oscillations as long as the gain in the amplifier is greater than the losses in the ladder network. With the signal inverting amplifier, the phase shift in the ladder network must lie between 90 degrees and 270 degrees to sustain oscillations.

An advantage of the above-described oscillator systems over the lumped LC resonating type resides in the fact that the generated frequency varies inversely as the capacitance rather than the square foot of the capacitance. A tunable frequency range of 10 to 1, for example, may thus be easily achieved. Decade frequency multipliers may then be used to cover several adjacent frequency ranges, yet require only one set of calibration points on the frequency dial. A corresponding variation of 10 to 1 in either the inductance or capacitance of the resonant circuit type oscillator will only produce a change in the generated frequency of the square root of 10, or 3 approximately.

The quality of the sine waves produced by the phase-shift oscillators, however, is apt to be poor when amplitude regulation is provided by operation of the amplifier tubes near their saturation points. To overcome the resulting distortion, it is feasible to include a separate amplitude control means, such as a lamp or thermistor, in the positive feedback loop of the oscillator. In the case of a lamp, for example, the heating effects of too high amplitude oscillations will cause the resistance of the lamp to increase an amount sufficient to attenuate the oscillations and thus provide a regulated output. However, the amplitude control means, of itself, often introduces distortion in the final output.

In the present invention, extremely low distortion is attained by modifying the elements of the conventional phase shift oscillator to acommodate a negative feedback loop, preferably supplying very substantial degeneration. It is well known that the distortion in any output wave can be materially reduced by incorporating the principles of negative feedback, but heretofore, phase-shift oscillators have been unsuited for use with large feedback factors. Suitable circuit arrangements have not been available and the gain of the present day amplifiers used in these oscillators has not been sufficient to supply the feedback required for the purity of waveform contemplated in the present invention. In fact, the use of more than one or two stages of amplification in such prior oscillators has been studiously avoided in practice due to the frequency dependent phase shifts introduced by the amplifying stages and the coupling networks between them.

In my invention, distortion is initially reduced in a phase-shift oscillator by placing the amplitude control means in the oscillating loop, followed by a resistance-reactance tuner of a form which filters from the circuit the distortion generated in the control means. In previous phase shift oscillators which employed a separate amplitude control means, it was not placed in the feedback loop containing the tuner because of the likelihood of frequency changes caused by the amplitude control means. Moreover, the low pass version of the resistance-capacitance ladder network has generally been avoided in practice because it requires much larger tuning capacitors than the high pass configuration and causes the oscillator to recover slowly after an overload or change in frequency. In spite of these disadvantages, the use of these two previously avoided arrangements, in combination, permits a substantial reduction in distortion level to be achieved. A further material reduction in distortion is then accomplished by adding a negative feedback loop and employing multiple amplifier stages providing tremendous amplification to accommodate the necessary negative feedback. Any adverse effect of phase shift in the amplifier is substantially eliminated by virtue of the large amount of negative feedback employed. Further improvement is realizable by incorporating a local regenerative feedback loop about the low level portion of the amplifier. Moreover, by adjusting this latter feedback loop to the critical point of regeneration, whereby the overall amplifier gain becomes infinite, a substantially zero internal oscillator impedance may be effected, thereby making the output signal voltage substantially independent of any connected load. Of course, when an attenuator is interposed between the oscillator proper and the load terminals, the internal impedance presented to the load will not be zero.

Figure 2:
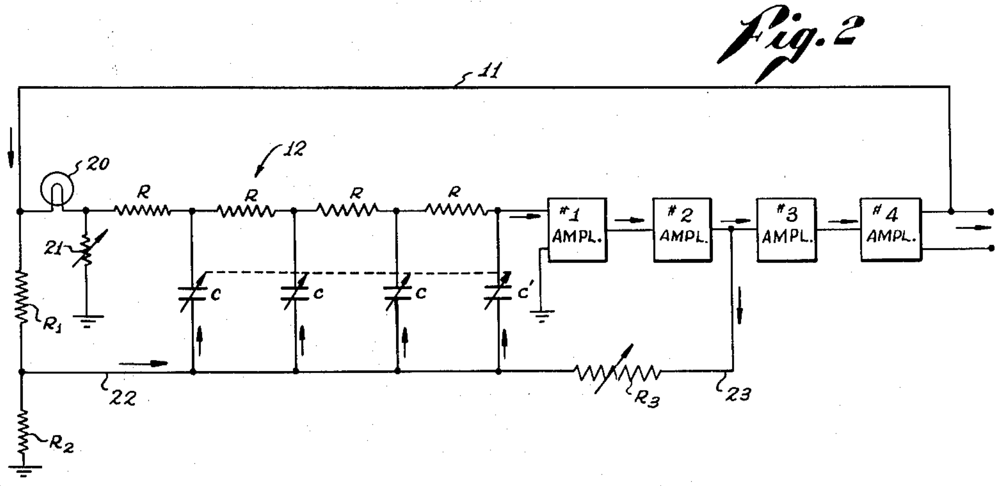
Figure 3:
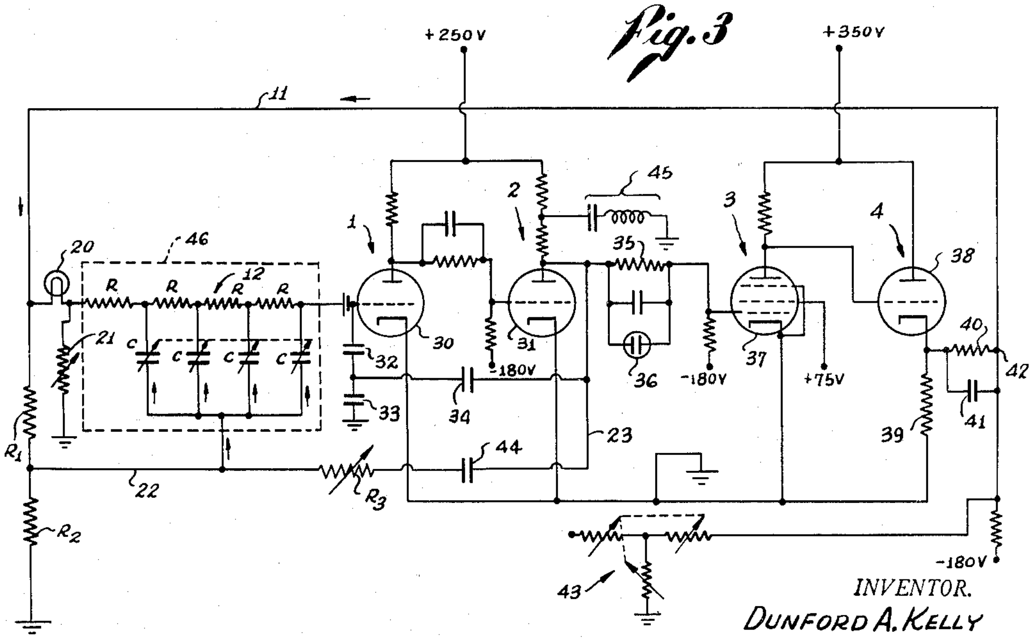

A better understanding of the invention and its further features and advantages will be had by referring to the accompanying drawing, in which:

Figure 1 shows in block schematic form a typical prior art phase-shift oscillator;

Figure 2 discloses a modification of the circuit of Figure 1 in accordance with the present invention; and Figure 3 is a detailed circuit diagram of a preferred form of the invention as schematically illustrated in Figure 2.

Referring now to Figure 1, there is shown a conventional oscillator comprising an amplifier 10, a positive feedback loop 11, and a resistance-capacitance tuner 12 which may include three series capacitors C and three shunting resistors R. Amplitude control is effected by amplifier saturation. The tuner is series connected between the output and input of amplifier 10 in the feedback loop 11.

In operation, any transient signal developed at the input of amplifier 10, upon turning on the oscillator, is amplified and inverted substantially 180° if the amplifier 10 includes an odd number of inverting stages. This output signal is fed back along the feedback loop 11 where its phase is shifted by the several resistance-capacitance sections of tuner 12. The relative values of R and C are calculated to provide approximately a 180° phase shift in the tuner at the desired oscillating frequency, so that the overall phase shift around the oscillating loop is approximately 0°. Since the gain of amplifier 10 is made greater than the losses suffered in tuner 12, a building up of oscillations will obtain. The distortion will be small as long as the amplifying stage or stages in amplifier 10 are prevented from saturating. Amplitude control is provided by amplifier saturation, but by reducing the circuit gain until oscillations are barely sustained, a wave form with as little as $\frac{1}{10}$ of 1% of harmonic distortion may be obtained. Unfortunately, the power output is then very small and the amplitude stability is poor.

It is of course to be understood that while at least three resistance-capacitance sections in tuner 12 are required for oscillation, the maximum number is not limited. In the case of the three RC sections shown, each shifts the phase about 60° at the oscillating frequency.

In accordance with the principles of the present invention, a vast improvement in distortion reduction can be achieved by modifying the circuit of Figure 1 as shown in Figure 2. In this embodiment the tuner 12 comprises a ladder network of series resistances and shunt capacitors forming L sections connected in series. An amplitude control means is disposed in the positive feedback loop immediately preceding the ladder network 12. This control element may take the form of a lamp 20 having a resistance which is a direct function of its temperature. Accordingly, when the amplitude of oscillations builds up, the heating will cause the resistance of lamp 20 to increase. A variable loading resistance 21 is connected between the common junction of lamp 20 and the first resistance R of tuner 12, and ground. This resistance 21 may be adjusted so that the voltage dividing action with the resistance of lamp 20 provides the desired amount of attenuation in the feedback circuit to control the amplitude of the oscillations. Alternatively, a thermistor element or a carbon filament lamp having a negative temperature coefficient of resistance could be used, in which case it would be connected in shunt with the tuner 12 replacing the resistance 21. A variable loading resistance would then be substituted for the lamp 20 to provide the necessary voltage dividing action. Many other types of amplitude control are feasible, but they do not share the simplicity of the lamp or thermistor circuit.

It will be noted that by virtue of the lamp arrangement as shown in Figure 2, any distortion originating in the lamp 20 such as third harmonics, for example, will be substantially filtered from the input by the shunting action of the several condensers C and C′.

The major portion of amplifier distortion reduction is attained by the use of a negative feedback loop 22. This loop is formed in part by the feedback loop 11 which supplies a portion of the output signal through resistance $R_1$ to resistance $R_2$ as shown. The signal developed across $R_2$ is in phase with the output and is fed along the path 22 into the input through the shunting capacitors C and C′ as indicated by the arrows. Since the phase of this signal is not appreciably shifted in passage through tuner 12 at the distortion frequencies, this signal is in proper phase to be degenerative, and thereby reduce the distortion.

As pointed out above, a very large amount of gain is necessary to accommodate this negative feedback in order that the net gain of the system as a whole will be at least unity and thus sustain the oscillations. To this end the amplifier of Figure 2 is preferably constructed to include four stages 1, 2, 3, 4, the last stage 4 of which constitutes a cathode follower wherein there is no signal inversion. Each of the various stages is designed to have an amplification sufficient to provide a total amplification when cascaded, greater than the losses in the negative feedback loop and tuner 12.

A further increase in gain to permit still more negative feedback can be effected by a local regenerative feedback loop 23 connected from the output of the second stage to the input of the first stage through the shunt condensers C and C′ in tuner 12. Since stages 1 and 2 each invert the signal 180°, the feedback is in properly regenerative phase. A variable resistance $R_3$ is included in loop 23 for adjusting the feedback to a critical value such that the cascaded stages 1 and 2 would be at the threshold of oscillation in the absence of all other feedback loops. As normally connected, the overall negative feedback loop obviates self-oscillation of this type. Theoretically, this adjustment to a condition of critical regeneration results in an infinite gain, in turn providing infinite feedback. Accordingly, the overall distortion in the final output signal is reduced to an unprecedented degree. It is also to be noted that the regenerative loop 23 when critically adjusted results in an internal oscillator impedance of substantially zero so that the oscillator signal voltage will be substantially independent of the connected load.

Referring now to Figure 3 there is shown in detail a preferred embodiment of the circuit of Figure 2. In this figure, corresponding elements shown in Figures 1 and 2 are designated by the same reference numerals. As shown in Figure 3, the first two amplifying stages 1 and 2 constitute resistance coupled triodes 30 and 31. Ordinarily, pentodes would be used to avoid the grid-plate inter-electrode capacitances of triodes, which cause grid loading currents, known as the "Miller" effect, but I have found that the problem of supplying suitably constant screen voltages to pentodes when they are directly coupled is difficult. The "Miller" effect in the first amplifier stage increases the oscillator distortion unless neutralization is provided. To overcome this effect, a novel form of neutralization is employed, wherein current of proper phase is obtained from the plate circuit of the second amplifier stage 31. To accomplish this, two series capacitors 32 and 33 are connected between the control grid of tube 30 and ground. A third capacitor 34 is connected between the plate of tube 31 and a point between the capacitors 32 and 33 as shown. With this arrangement the value of capacitor 32, 33, or 34 may be adjusted to neutralize or annul substantially the grid-plate capacitance in tube 30. While a single capacitor of very small size connected from the plate of tube 31 to the grid of tube 30 would provide suitable neutralization, a conveniently adjustable capacitor of such small size is not readily available.

The use of triodes in a feedback amplifier may render the system susceptible to oscillations during and after overload because a triode feedback amplifier depends on the dynamic resistance of the vacuum tube plate circuits to control the high frequency response. Thus when the amplifier overloads, the plate resistances may approach infinity, thus changing the constants of the circuit by a very large amount and allowing oscillations to start. Once started, these spurious oscillations would probably be sustained. It is possible to eliminate this effect by using a gaseous glow lamp to prevent the triode grid biases from approaching cut-off. In Figure 3 such a glow lamp 36 is shunted across the coupling resistance 35 between stages 2 and 3 and is sufficient in action to prevent sustained oscillation after amplifier overload. Alternatively, the grid bias of a triode may be prevented from reaching cutoff by the connection of a biased rectifier to said grid circuit, whereby the grid bias cannot greatly exceed the negative voltage at which the rectifier begins to conduct.

Stage 3 may comprise a pentode 37 directly coupled to the grid of a cathode follower tube 38 in stage 4. This direct coupling may be effected because the cathode follower runs at an elevated potential since the output signal is taken from the cathode terminal. The cathode follower will correct for its own distortion in large part, due to its inherent negative feedback characteristic. The output from the cathode is reduced to approximately ground potential by resistor 40. The function of capacitor 41 is to transmit the oscillating signal voltage without attenuation. The signal at terminal 42 of the oscillator proper may be fed through an ordinary variable resistance attenuator pad 43 to control the signal amplitude. The same output signal from terminal 42 is also fed back through the loop 11 which transmits both the negative and positive feedback voltages. The positive feedback path is through the amplitude control lamp 20, resistance-capacitance tuner 12, and into the input of stage 1 as described in connection with Figure 2. The negative feedback loop 22 and local regenerative feedback loop 23 are also connected in the same manner as described in Figure 2, a D. C. blocking capacitor 44 being shown, however, in the loop 23 of Figure 3. The capacitors shunting the coupling resistances between stages 1 and 2 and stages 2 and 3 are of proper size to permit the voltage gain of each stage to be transmitted to the next stage without serious loss at even the lowest oscillating frequencies.

To provide controlled amplification at the very high frequencies, a small series capacitor and inductance circuit 45 is connected between a tap on the plate load resistor of tube 31 in stage 2 and ground. This trap circuit furnishes a major part of the high frequency compensation required to insure the stability of the feedback amplifier.

An important feature of this oscillator circuit is the use of direct coupling throughout the oscillating loop. This feature renders the oscillator much more stable at low frequencies than it would be with the large coupling capacitors otherwise required. A further advantage over capacitor coupling is rapid amplifier recovery after overload, caused for example, by the connection of a load resistor of too low value.

In operation, the oscillator of Figure 3 will oscillate at a frequency determined by the values of R and C in the tuner 12. This frequency may be controlled by adjusting the ganged tuning condensers C and C′ to a desired value or by connecting various sets of tuning resistors R by actuation of a frequency range switch. The frequency of oscillation will establish itself at that point where the phase shift in the tuner is substantially 180°. This phase shift added to the phase inversion in the amplifier results in a total phase shift of 0° which is most favorable for oscillation. At higher frequencies the transmission through the tuner, by virtue of the capacitors C and C′, becomes less than the degenerative feedback through loop 22, while the overall phase shift departs from 0°, thereby discouraging oscillation. At lower frequencies there is more transmission through the tuner but again the overall phase shift departs from 0°, again discouraging oscillations.

The inclusion of the negative feedback loop 22 with a substantial feedback factor, reduces the effect of amplifier changes on oscillation frequency and amplitude, to a practically negligible level.

The provision of several amplifier stages with correspondingly high gain and its consequent utilization by the introduction of a large amount of negative feedback through loop 22 in accordance with the invention, is what enables the distortion originating in the amplifier stages of this oscillator to be reduced far below previous levels. The other source of distortion is the amplitude control means. By using a low distortion amplitude control device, followed by a tuner that discriminates against the harmonics generated in the amplitude control device, the distortion from this source has also been reduced far below previous levels.

For the particular oscillator of Figure 3, an effective feedback factor of about 100 db is required to reduce the final output signal distortion to well below $1/1000$ of 1% and still provide substantial output power. About 60 db of this factor is provided by the negative feedback loop 22. Another 30 db is realized by the novel introduction of the local regenerative feedback loop 23 about the first two stages. The final 10 db reduction is achieved in the cathode follower circuit by virtue of its inherent negative feedback characteristics.

In resistance-capacitance tuned oscillators, dust particles lodging between the plates of the tuning capacitors, being hygroscopic, attract moisture when the relative humidity is high, and conduct electricity, thereby rendering the operation of the oscillator erratic. This effect can be overcome by housing the tuning elements in a sealed chamber 46 as shown by the dotted lines in Figure 3. A suitable drying agent in chamber 46 may be used to maintain the relative humidity on the order of 30% or lower. This controlled atmosphere has been found to solve the problem of erratic operation satisfactorily.

It is to be understood that while the specific embodiment of the oscillator in Figure 3 has been described as employing vacuum tubes, it is contemplated that other types of tubes or other forms of amplifying devices such as transistors may be substituted for the various tubes shown. Further, the number of amplifying stages need not necessarily be four, but only of a number which will provide the necessary gain for the negative feedback principle to be effective.

Various modifications of the apparatus disclosed within the spirit of the present invention are possible. For example, the local regenerative feedback loop 23 of Figure 3 may be applied about stages 2 and 3. In this case, the output impedance could still be made substantially zero, but it is found that the distortion is not as effectively reduced. Further, the three capacitors C of the tuner 12 might have their stators grounded and the negative feedback fed solely through the capacitance C′. It is also possible to eliminate the resistors $R_1$ and $R_2$ and supply a negative feedback loop directly from the output to the input of the first stage following the tuner 12. This would necessitate an extremely large series resistance in the feedback path. Furthermore, in an oscillator with switched range resistors, the feedback resistance would also require switching. The tuner could alternatively use variable resistors and switched capacitors.

The oscillator is easily adapted, additionally, to fixed frequency operation or operation at any one of a group of fixed frequencies.

Still other modifications will occur to those skilled in the art. The invention is not to be thought of as limited to the precise embodiments disclosed.

I claim:

1. In a resistance-reactance phase shift oscillator, the combination of: a multistage phase inverting amplifier having input and output circuits, circuit means forming a signal voltage feedback path from said output circuit to said input circuit, a phase shift tuner comprising a ladder network of resistances and reactances forming a plurality of series connected L-sections in said feedback path adapted to invert the phase of the feedback signal voltage at the operating frequency determined by the tuner and thereby impress a regenerative feedback signal voltage on said input circuit, and circuit means forming a degenerative signal voltage feedback path from said output circuit to said input circuit.

2. The subject matter of claim 1, in which said multistage amplifier includes a front section having an output circuit from which a signal voltage of un-inverted phase may be obtained, and circuit means forming a local regenerative signal voltage feed path from said output circuit of said front section to said input circuit of said amplifier, said last mentioned circuit means being adjusted to increase the overall amplified gain substantially to infinity, whereby the internal impedance of the oscillator is reduced substantially to zero and the output signal voltage from the oscillator becomes substantially independent of any load connected across its output circuit.

3. The subject matter of claim 2, wherein said amplifier includes at least four stages, and in which said circuit means forming said local regenerative voltage feedback path is connected from the output circuit of the second amplifier stage to the amplifier input circuit.

4. The subject matter of claim 1, in which said circuit means forming said voltage feedback path containing said phase inverting ladder network is direct coupled from said amplifier output circuit to said amplifier input circuit, and including an amplitude control means in said circuit means preceding said ladder network.

5. The subject matter of claim 4, wherein said ladder network comprises a plurality of series connected resistors and a like plurality of shunt capacitors forming a low pass filter which filters out harmonic signals introduced by said amplitude control means.

6. The subject matter of claim 5, wherein said amplitude control means comprises a circuit element having a resistance which is a function of its temperature, and a voltage dividing loading resistor for said circuit element.

7. The subject matter of claim 1, wherein said ladder network comprises a plurality of series connected resistors and a like plurality of shunt capacitors, and wherein said degenerative voltage feedback path is through at least one of said capacitors.

8. The subject matter of claim 1, wherein said ladder network comprises a plurality of series connected resistors and a like plurality of shunt capacitors, and wherein said degenerative voltage feedback path is through said capacitors in shunt.

9. The subject matter of claim 1, wherein said ladder network comprises a plurality of series connected resistors and a like plurality of shunt capacitors, and wherein said amplifier has at least four stages, and circuit means forming a local regenerative voltage feedback path from the output circuit of the second amplifier stage through said shunt capacitors of said ladder network to the amplifier input circuit.

10. In an oscillator, the combination comprising: a phase inverting amplifying means including four stages connected in cascade, each of said stages comprising a tube having at least a cathode, anode, and control grid, the last stage comprising a cathode follower tube, a direct electrical connection between the output of the voltage amplifying tube preceding the cathode follower tube and the control grid of said cathode follower tube, circuit means forming a direct coupling voltage feedback path including a tuner comprising a ladder network of resistances and reactances forming L-sections connected in series between the output of said cathode follower tube and the input to said first stage and adapted to invert the phase of the feedback voltage at the operating frequency determined by the tuner and thereby impress a regenerative feedback signal voltage on said input circuit, an amplitude control means included in said feedback path immediately preceding said ladder network, and circuit means forming a degenerative voltage feedback path between the output of the last stage and the input of the first stage.

11. An oscillator according to claim 10, including circuit means forming a local regenerative voltage feedback path between the output of the second stage and the input of the first stage such that in combination with said amplifying means, the output terminal impedance of said oscillator is reduced to substantially zero.

12. An oscillator according to claim 10, in which the tube in the first stage is a triode and there is provided capacity neutralizing means connected between the anode circuit of the tube in said second stage and the control grid circuit of the tube in said first stage, such that grid-plate capacitance in the tube of said first stage is substantially neutralized.

13. An oscillator according to claim 10, including a resistance coupling between the second and third stages, and control means comprising glow tube means shunting said resistance coupling for preventing spurious oscillations.

14. In a resistance-capacitance phase shift oscillator, the combination of: a multistage phase inverting amplifier, each stage of which comprises an amplifier device having cathode, anode and control elements, said amplifier having an input circuit including a terminal connected to the control element of the first stage amplifying device, and having an output circuit across which a load may be connected, a voltage feedback network connected between said output circuit and said input circuit, said network comprising a pair of voltage dividing resistors connected in series across the output circuit of said amplifier, a first network terminal located between one side of said amplifier output circuit and a first resistor of said pair, a second network terminal located between the first and second resistors of said pair, a phase shift tuner comprised of a ladder network having first and second arms connecting a plurality of resistor-reactor L-sections in series, the resistors being in series in the first of said arms, and the capacitors being connected in shunt across said arms, said first arm of said ladder network being connected at one end to said first network terminal and at the other to said amplifier input circuit terminal, and the second arm of said ladder network being connected to said second network terminal, and an amplitude control element in said feedback network between said first network terminal and said first arm of said ladder network, said tuner being adapted to invert the phase of the inverted output amplifier voltage developed across said first voltage dividing resistor at the operating frequency determined by the tuner and thereby impress a regenerative feedback voltage on said amplifier input circuit terminal, there being a phase inverted feedback signal voltage developed across said second voltage dividing resistor which is fed without further inversion via said second arm of said ladder network and said shunt capacitors to said amplifier input circuit terminal and thereby impressed as a degenerative signal voltage on said amplifier input circuit.

15. The subject matter of claim 14, wherein said amplifier has at least four stages, of which the first and second are phase inverting, and including also circuit means impressing a portion of the uninverted output voltage of the second stage across said second voltage dividing resistor, whereby to develop an uninverted voltage thereacross which is also fed without further inversion through said shunt capacitors and impressed as a regenerative signal voltage on said amplifier input circuit.

16. The subject matter of claim 1, wherein said phase shift tuner employs tuning condensers, and the tuner is enclosed in a sealed housing equipped with means providing a dry, humidity-controlled atmosphere.

References Cited in the file of this patent

UNITED STATES PATENTS

| | | |
|---|---|---|
| 1,950,535 | Young | Mar. 13, 1934 |
| 2,258,128 | Black | Oct. 7, 1941 |

| | | |
|---|---|---|
| 2,346,396 | Rider | Apr. 11, 1944 |
| 2,386,892 | Hadfield | Oct. 16, 1945 |
| 2,441,567 | Darlington | May 18, 1948 |
| 2,447,248 | Harris | Aug. 17, 1948 |
| 2,568,868 | Pratt | Sept. 25, 1951 |
| 2,586,167 | Kamm | Feb. 19, 1952 |